(12) United States Patent  
Bresch (10) Patent No.: US 7,659,845 B2  
(45) Date of Patent: Feb. 9, 2010

(54) ANALOG-TO-DIGITAL CONVERTER WITH CAPACITOR ARRAY

(75) Inventor: Manfred Bresch, Villach (AT)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 12/143,293

(22) Filed: Jun. 20, 2008

(65) Prior Publication Data

US 2009/0319211 A1    Dec. 24, 2009

(51) Int. Cl.
*H03M 1/12* (2006.01)
(52) U.S. Cl. .................................. 341/172; 341/155
(58) Field of Classification Search .......... 341/155–172
See application file for complete search history.

(56) References Cited

U.S. PATENT DOCUMENTS

| | | | | |
|---|---|---|---|---|
| 4,129,863 A | * | 12/1978 | Gray et al. ................. | 341/172 |
| 4,764,753 A | * | 8/1988 | Yukawa ...................... | 341/166 |
| 6,538,594 B1 | * | 3/2003 | Somayajula ................ | 341/172 |
| 6,885,331 B2 | * | 4/2005 | Krymski ..................... | 341/169 |
| 6,954,170 B2 | * | 10/2005 | Leung ......................... | 341/172 |
| 6,977,607 B2 | * | 12/2005 | Leung et al. ................ | 341/172 |
| 7,002,404 B2 | * | 2/2006 | Gaggl et al. ................. | 327/553 |
| 7,015,841 B2 | * | 3/2006 | Yoshida et al. ............. | 341/120 |
| 7,199,746 B1 | | 4/2007 | Chowdhury et al. | |
| 7,450,048 B2 | * | 11/2008 | Lin ............................. | 341/155 |
| 7,463,086 B2 | * | 12/2008 | Tan et al. .................... | 327/557 |

\* cited by examiner

*Primary Examiner*—Lam T Mai  
(74) *Attorney, Agent, or Firm*—Dickstein, Shapiro, LLP.

(57) ABSTRACT

An analog-to-digital converter comprising a capacitor array having a plurality of unit capacitors, each having first and second inputs; a comparator having a pair of inputs and at least one output; and a controller configured to couple one input of each unit capacitor of the plurality of capacitors to the inputs of the comparator, and to control a feedback loop between the pair of inputs and the at least one output of the comparator.

20 Claims, 8 Drawing Sheets

ANALOG-TO-DIGITAL CONVERTER WITH CAPACITOR ARRAY

FIELD OF THE INVENTION

The present invention generally relates to analog-to-digital converters and more particularly to an apparatus and method of analyzing analog-to-digital converters.

BACKGROUND OF THE INVENTION

Analog-to-digital converters (A/D converters) are well known in the art as circuits that change a continuously varying voltage or current into numerical digital form. The input may be AC (alternating current) or DC (direct current), and the output may be serial or parallel, binary or decimal. A/D converters produce a digital output code that is a function of the analog input voltage and a voltage reference input. Moreover, the width of a given digital output code corresponds to a range of analog input voltages for which that code is produced.

In an ideal A/D converter, each output code has an identical width, meaning the range of analog input voltages remains constant from one code transition point to the next. However, practically speaking, all A/D converters suffer from non-linearity due to their physical imperfections, causing their outputs to deviate from an ideal linear function.

There are two measurements of non-linearity: differential non-linearity (DNL) and integral non-linearity (INL). DNL occurs when the range of analog input voltages is not uniform for all digital output values. As such, DNL indicates the difference between the actual output code width and the ideal code width of one least significant bit (LSB). DNL may be caused by inaccuracies in capacitor sizing that often leads to missing codes in the output of the A/D converter. Missing codes in the output results in granularity and effectively reduces a dynamic range of the converter's output. INL is the cumulative deviation over a number of consecutive code values, i.e., cumulative DNL errors, and specifies how much the overall transfer function deviates from an ideal linear response.

Conventional methods for determining the DNL and INL of an A/D converter include using either a quasi-DC voltage ramp or a low-frequency analog voltage as the input. A simple DC-voltage ramp test can incorporate a logic analyzer, a high-accuracy digital-to-analog converter (D/A converter), and a high-precision DC source for sweeping the input range of the A/D converter being tested. If the setup includes a high-accuracy D/A converter, the logic analyzer monitors offset and gain errors by directly processing the A/D converter's output data. The precision signal source creates test voltages for the converter being tested by sweeping through the input range of the converter from zero to full scale. Once reconstructed by the D/A converter, each test voltage at the A/D converter input is subtracted from its corresponding DC level at the output of the D/A converter, producing a small voltage difference that can be displayed with an X-Y plotter and linked to the INL and DNL errors. A change in quantization level indicates differential nonlinearity, and a deviation of the differential voltage from zero indicates the presence of integral nonlinearity.

DETAILED DESCRIPTION OF PREFERRED EMBODIMENT OF THE INVENTION

By way of overview, the present invention provides an A/D converter comprising a capacitor array having a plurality of unit capacitors that may be tested on a unit by unit basis. In particular, an apparatus and method is provided that can perform a self-test of the capacitor array by measuring the differential voltage between a pair of unit capacitors with respect to a sample input voltage of the capacitor array. Each differential voltage is converted to digital form applying conventional analog-to-digital conversion techniques, which provides a digital representation of the capacitance of the pair of unit capacitors. This process is then repeated for all pairs of unit capacitors in the capacitor array. Applying the digital form for each measured capacitance, the differential nonlinearity (DNL) and integral nonlinearity (INL) of the A/D converter can be measured.

Figure 1:
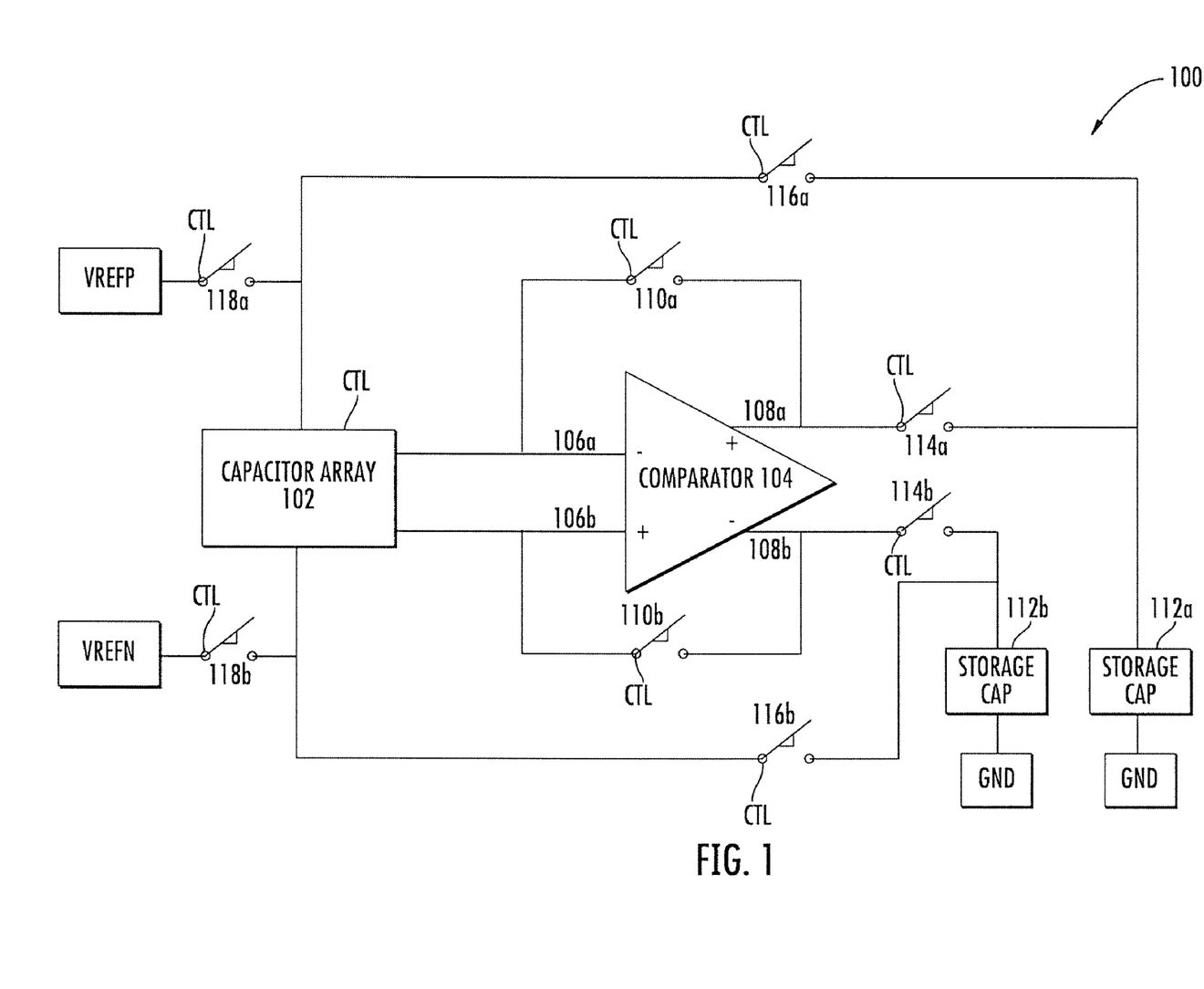
FIG. 1 is a detailed schematic diagram of the A/D converter in accordance with an exemplary embodiment of the present invention.

Referring to FIG. 1, a schematic diagram of an A/D converter 100 is shown in accordance with an exemplary embodiment of the present invention. A/D converter 100 includes a capacitor array 102 having a plurality of unit capacitors (see, for example, FIGS. 4A and 4B). Each unit capacitor has a pair of conductors called plates which constitute first and second capacitor inputs. In the exemplary embodiment, capacitor array 102 consists of 8192 unit capacitors, divided into two banks of 4096 capacitors, though it should be appreciated that the invention is not limited to capacitor array 102 having any particular number of capacitors. Capacitor array 102 is coupled to a pair of inputs of a multistage comparator 104, such that 4096 unit capacitors (i.e., one bank) of capacitor array 102 are coupled to inverting input 106a and 4096 unit capacitors (i.e., one bank) of capacitor array 102 are coupled to non-inverting input 106b.

In the exemplary configuration, capacitor array 102 provides for an A/D converter with a resolution of 12 bits. As is well known to those of ordinary skill in the art, an n bit A/D converter requires $2^n$ pairs of unit capacitors coupled to the comparator. In the exemplary configuration, 4096 (i.e., $2^{12}=4096$) unit capacitors are coupled to each comparator input 106a, 106b. The resolution of the A/D converter indicates the number of discrete values produced over the range of inputted analog values. In alternative embodiments of the present invention, the capacitor array 102 provides for an A/D converter with n number of bits, comprising $2^n$ pair of unit capacitors coupled to the comparator.

Referring back to FIG. 1, capacitor array 102 is coupled to differential reference voltages $V_{REFP}$ and $V_{REFN}$ and is further configured to receive a control signal CTL from a controller (not shown). Switches 118a, 118b are coupled between capacitor array 102 and reference voltages $V_{REFP}$ and $V_{REFN}$, respectively, and are also controlled by the controller. Each component shown in the accompanying drawings controlled by the controller (not shown) is denoted by "CTL". Such denotations are not intended to indicate that the respective components receive the same signal, but merely that those components of A/D converter 100 are configured to receive a control signal from the controller during operation.

It should be further understood that while A/D converter 100 is configured to provide a self-test of capacitor array 102, once this self-test is complete, A/D converter 100 may function as a conventional A/D converter. Accordingly, A/D converter 100 may further comprise an input configured to receive an analog voltage to be converted. Because the input is not used during the described self-test, the input is not shown in FIG. 1 so as to not unnecessarily obscure aspects of the present invention.

As discussed above, the multistage comparator 104 includes an inverting input 106a and a non-inverting input 106b, configured to receive an input voltage from capacitor array 102. Comparator 104 includes a non-inverting output 108a and an inverting output 108b that may be coupled to inputs 106a and 106b, respectively, to provide feedback loops for comparator 104. In an alternative embodiment of the present invention, comparator 104 comprises a single output that may be coupled to either comparator input.

Each feedback loop of comparator 104 employs a respective switch 110a, 110b. The controller (not shown) is coupled to switches 110a, 110b and, therefore, adapted to open and close these switches. When switches 110a, 110b are closed, comparator 104 operates with unity gain enabling a sampling of the analog input voltage signals. In contrast, when switches 110a, 110b are open, comparator 104 operates as a high-speed comparator.

The outputs 108a, 108b of comparator 104 are further coupled to storage capacitors 112a, 112b, respectively, which store an amplified differential output from the comparator. Specifically, the respective first plates of storage capacitors 112a, 112b are coupled to comparator outputs 108a, 108b and the respective second plates are coupled to ground. It should be understood that while a comparator of a conventional A/D converter provides a digital output, A/D converter 100 has an additional analog access point after a third amplification stage of the multistage comparator, which is coupled to storage capacitors 112a, 112b. Accordingly, the voltage applied to the storage capacitors 112a, 112b is in analog rather than digital form during the self-test process.

Moreover, switches 114a, 114b control the connection between the comparator outputs 108a, 108b and storage capacitors 112a, 112b. Switches 114a, 114b are also controlled by the controller. The respective first plates of the storage capacitors 112a, 112b are further coupled to switches 116a, 116b, respectively. As a result, any voltage that is stored on the storage capacitors can be applied as an input voltage to capacitor array 102. Alternatively, switches 114a and 116a as well as switches 114b and 116b can be replaced by single switches, respectively, as should be known to those of ordinary skill in the art.

Referring to FIGS. 2A-2D, schematic diagrams of the A/D converter 100 are shown in accordance with an exemplary embodiment of the present invention, which represent four configurations of A/D converter 100. These configurations, which will be discussed in detail below, enable four steps for analyzing the A/D converter 100. Specifically, the A/D converter 100 measures an analog input voltage from capacitor array 102 as a reference pattern, as described below with respect to the configuration shown in FIG. 2A; reverses the coupling of two unit capacitors in capacitor array 102 to measure a differential voltage, as described below with respect to the configuration shown in FIG. 2B; and performs a conventional analog-to-digital conversion of the differential voltage, which involves two separate steps, as described below with respect to the configurations shown in FIGS. 2C and 2D. While the exemplary embodiment employs four steps, the present invention is intended to cover alternative, modified, and equivalent processes and configurations for analyzing an A/D converter, which may be included within the spirit and scope of the invention.

Figure 2A:
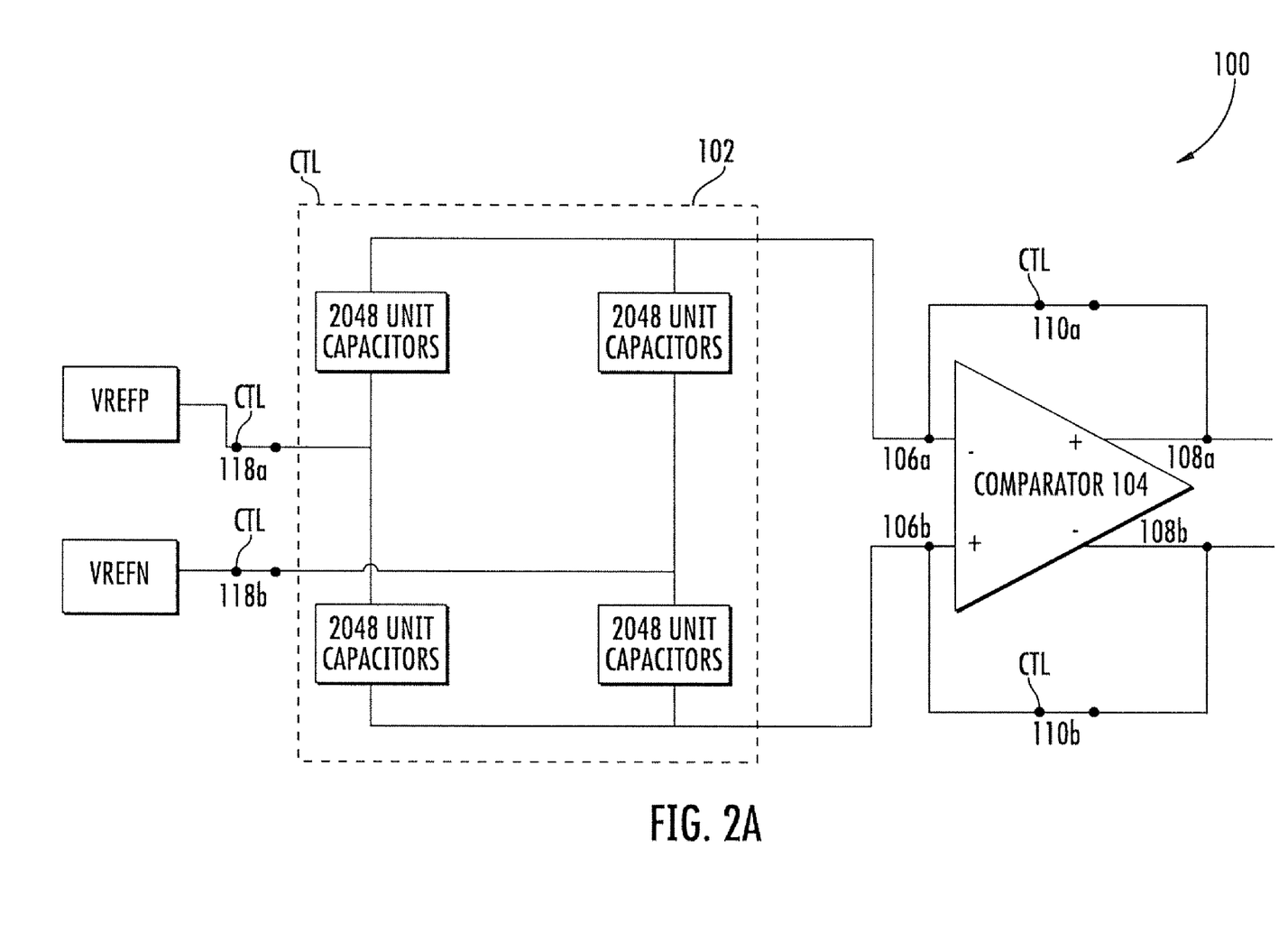
FIG. 2A is a detailed schematic diagram of a first configuration of the A/D converter in accordance with an exemplary embodiment of the present invention.

Referring specifically to FIG. 2A, a detailed schematic of a first configuration of the A/D converter is shown in accordance with the present invention. As discussed above, A/D converter 100 comprises a capacitor array 102 consisting of 8192 unit capacitors. Moreover, the controller (not shown) is adapted to provide a control signal to each of the switches of A/D converter 100. In this first configuration, switches 110a, 110b and 118a, 118b are closed while switches 114a, 114b (not shown) and 116a, 116b (not shown) are open. By closing switches 110a, 110b, comparator 104 operates with feedback, as a unity gain amplifier enabling it to sample an analog input voltage from capacitor array 102.

The controller provides a control signal to capacitor array 102 to couple the 8192 unit capacitors between the differential reference voltages $V_{REFP}$, $V_{REFN}$ and the inputs 106a, 106b of comparator 104. Accordingly, comparator 104, samples an analog input voltage from the capacitor array 102, which serves as a reference pattern. It should be understood to those of ordinary skill in the art that to couple a unit capacitor between a reference voltage and a comparator input, a first plate is coupled to the reference voltage and a second plate is coupled to the comparator input, or vice versa.

As shown in FIG. 2A, 2048 unit capacitors are coupled between $V_{REFP}$ and non-inverting input 106b; 2048 unit capacitors are coupled between $V_{REFP}$ and inverting input 106a; 2048 unit capacitors are coupled between $V_{REFN}$ and inverting input 106a; and 2048 unit capacitors are coupled between $V_{REFN}$ and non-inverting input 106b. In this configuration, the differential comparator input voltage should equal zero volts. In alternative embodiments, different groupings of capacitors may be coupled between the differential reference voltages and the comparator inputs resulting in different sampled input voltages. In one such embodiment, 4096 unit capacitors are coupled between $V_{REFP}$ and non-inverting input 106b and 4096 unit capacitors are coupled between $V_{REFN}$ and inverting input 106a. While functional, such an arrangement would lead to a very large differential output voltage from comparator 104, potentially saturating comparator 104 and affecting the overall analysis of A/D converter 100.

Figure 2B:
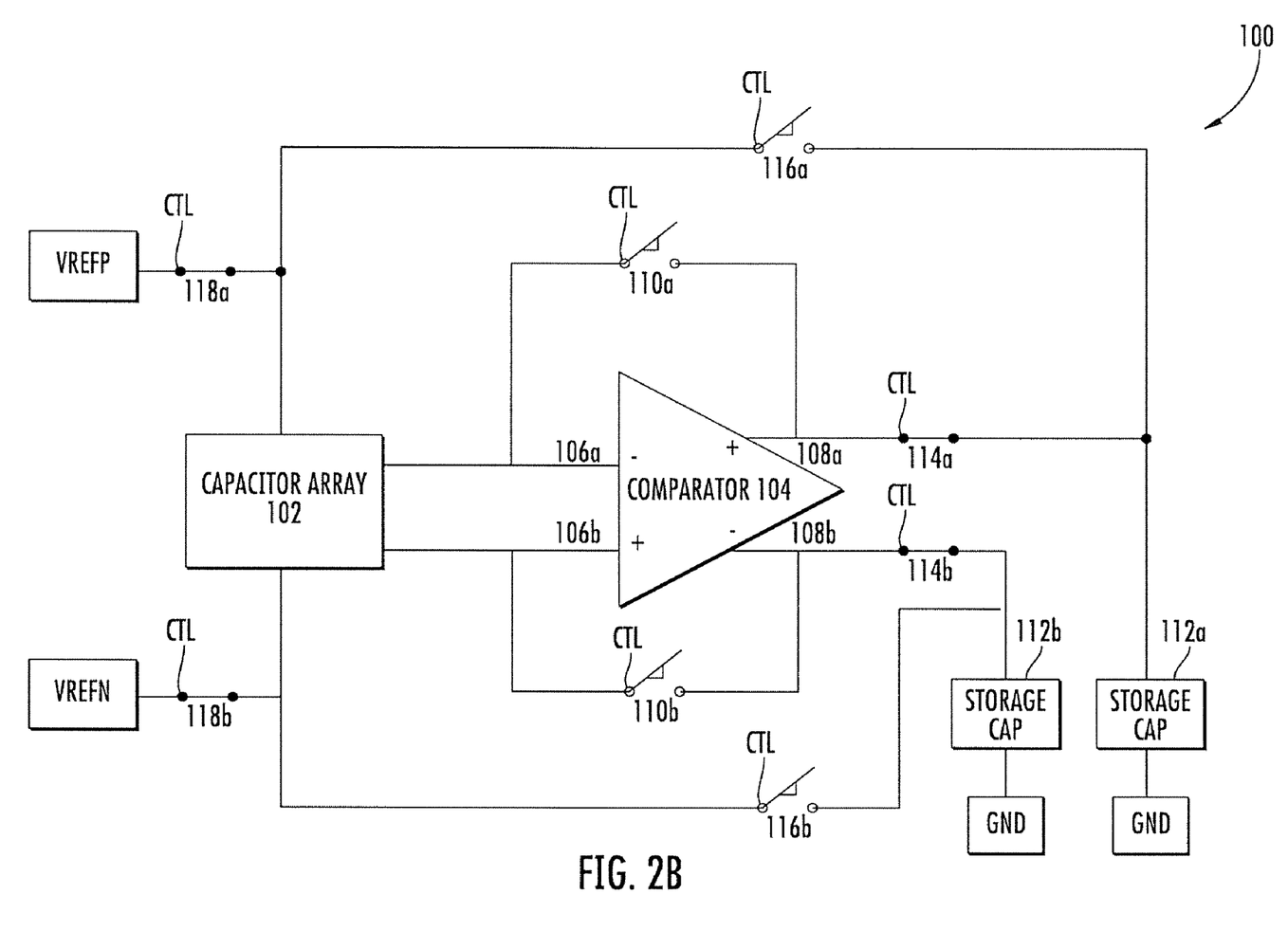
FIG. 2B is a detailed schematic diagram of a second configuration of the A/D converter in accordance with an exemplary embodiment of the present invention.

Once the reference pattern is sampled, the A/D converter 100 is reconfigured to a second configuration as shown in FIG. 2B. In this configuration, the controller (not shown) of A/D converter 100 provides a control signal to open switches 110a, 110b and close switches 114a, 114b (switches 118a, 118b remain closed and switches 116a, 116b remain open). By opening switches 110a, 110b, comparator 104 operates as a high speed comparator, and, therefore, is adapted to provide an amplified differential voltage at outputs 108a, 108b.

The controller (not shown) of A/D converter 100 is also adapted to select a unit capacitor X from capacitor array 102 and reverse its couplings between the reference voltage and the comparator input. To compensate for this switch, the controller also reverses the coupling of another unit capacitor Y. This compensation is to maintain 4096 unit capacitors coupled to each comparator input 106a, 106b, respectively, during the analysis of A/D converter 100.

As discussed above, 2048 unit capacitors of capacitor array 102 are coupled between $V_{REFP}$ and non-inverting comparator input 106b. Accordingly, the controller selects unit capacitor X, which may be one of these 2048 unit capacitors, and reverses its couplings, such that one plate is now connected to $V_{REFN}$ and one plate is connected to inverting input 106a. To compensate for this switch, the couplings of a second unit capacitor Y are reversed. If unit capacitor Y is coupled between $V_{REFN}$ and inverting input 106a in the first configuration, its couplings are now reversed, such that one plate is coupled to $V_{REFP}$ and one plate is coupled to non-inverting input 106b. Unit capacitor X can be selected by the controller from any one of the four groupings shown in FIG. 2A.

As a result of this substitution, comparator 104 measures the differential input voltage across its inputs 106a, 106b and outputs an amplified differential analog voltage that is stored by storage capacitors 112a, 112b. As described below with respect to the configurations shown in FIGS. 2C and 2D, A/D converter 100 then performs an analog-to-digital conversion for which the digital representation of the capacitance of unit capacitors X and Y is used to calculate the DNL and INL for the particular output code of A/D converter 100.

Figure 2C:
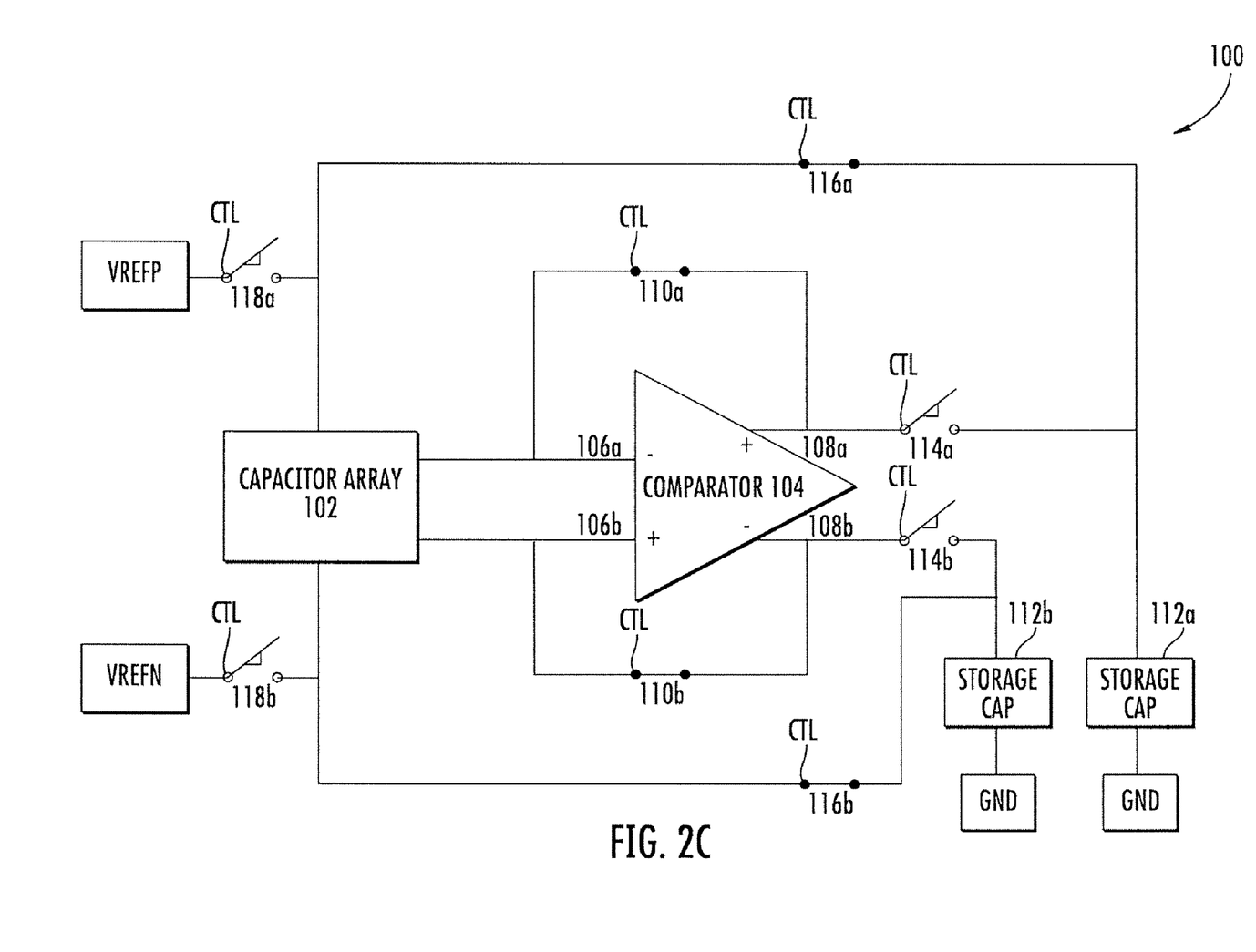
FIG. 2C is a detailed schematic diagram of a third configuration of the A/D converter in accordance with an exemplary embodiment of the present invention.
Figure 2D:
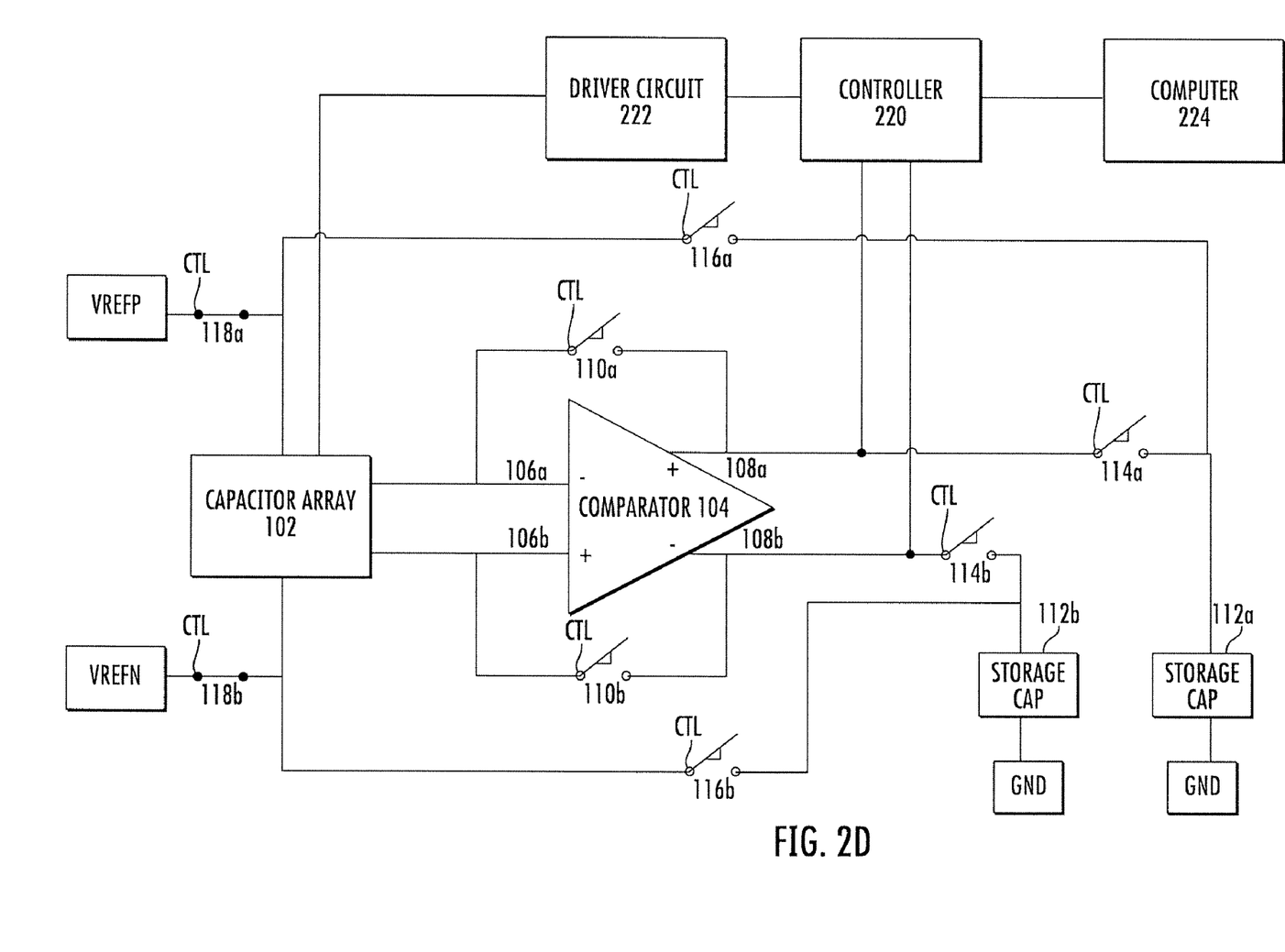
FIG. 2D is a detailed schematic diagram of a fourth configuration of the A/D converter in accordance with an exemplary embodiment of the present invention.

FIGS. 2C and 2D are detailed schematics of the configuration of A/D converter 100 shown in accordance with analog-to-digital conversion of the differential voltage. The analog differential voltage is converted using Successive Approximation Register (hereinafter "SAR") conversion techniques. SAR A/D converters convert a continuous analog waveform into a discrete digital representation applying a binary search through all possible quantization levels before converging upon a digital output for each conversion. SAR A/D converters typically employ a binary weighted capacitor array consisting of a plurality of branches, each of which is composed of a different number of unit capacitors coupled in parallel. In operation, the capacitor array can serve as a D/A converter as is required by SAR conversion.

To perform an analog-to-digital conversion, the SAR based converter initially operates in a sample mode wherein an input voltage is sampled onto a plurality of unit capacitors in the array. To implement the binary search algorithm, the SAR is initialized so that the most significant bit (hereinafter "MSB") is set to a digital 1. This code is fed into the D/A converter, which in turn supplies the analog output of the digital code ($V_{REF}/2$) to a comparator for comparison with the sampled input voltage. If the comparator output is a logic high, the MSB of the N-bit register remains at 1, otherwise, it is set to 0. The next bit is then set to 1 and the binary search continues until the LSB has been tested. The resulting code is the digital approximation of the sampled input voltage and is finally output by the A/D converter at the end of the conversion process.

Referring specifically to FIG. 2C, a detailed schematic of an exemplary third configuration of the A/D converter is shown in accordance with the present invention. In this configuration, A/D converter 100 operates in a sample mode wherein an input voltage is sampled onto a plurality of unit capacitors in the capacitor array 102. In particular, the controller (not shown) of A/D converter 100 provides a control signal to close switches 110a, 110b and 116a, 116b and to open switches 114a, 114b and 118a, 118b.

As discussed above with respect to FIG. 2A, closing switches 110a, 110b configures comparator 104 to operate with feedback and function as a unity gain amplifier enabling it to sample an analog input voltage from capacitor array 102.

Moreover, by closing switches 116a, 116b and opening switches 114a, 114b, storage capacitors 112a, 112b are coupled to the capacitor array 102 such that the stored amplified differential voltage is provided as an input voltage to the unit capacitors of the capacitor array 102. Differential reference voltages $V_{REFP}$ and $V_{REFN}$ are also decoupled from capacitor array 102 by opening switches 118a, 118b. As a result, comparator 104 samples the input voltage applied to the capacitor array 102, i.e., the differential voltage provided by the storage capacitors 112a, 112b.

FIG. 2D is a schematic of an exemplary fourth configuration of the A/D converter shown in accordance with the present invention. In the exemplary embodiment, A/D converter 100 is configured as a SAR based A/D converter. Accordingly, switches 110a, 110b are again open, such that comparator 104 operates as a high speed comparator. Furthermore, switches 118a, 118b are closed and switches 116a, 116b are open such that the differential reference voltages $V_{REFP}$ and $V_{REFN}$ are coupled to capacitor array 102. Capacitor array 102 is adapted to function as a D/A converter and controller 220 is adapted to operate as a SAR controller to perform a binary search algorithm. The controller 220 typically employs a driver circuit 222 configured to activate different branches of the capacitor array 102 relating to different bits of the D/A converter. Effectively, the input voltage is compared with the sampled voltage using conventional SAR conversion techniques, providing a resulting code which is the digital approximation of the analog differential input voltage. This digital approximation represents the capacitance of the pair of unit capacitors X and Y and is output to a computer 224 or the like in order to calculate the DNL and INL for the particular output code of A/D converter 100.

Figure 3:
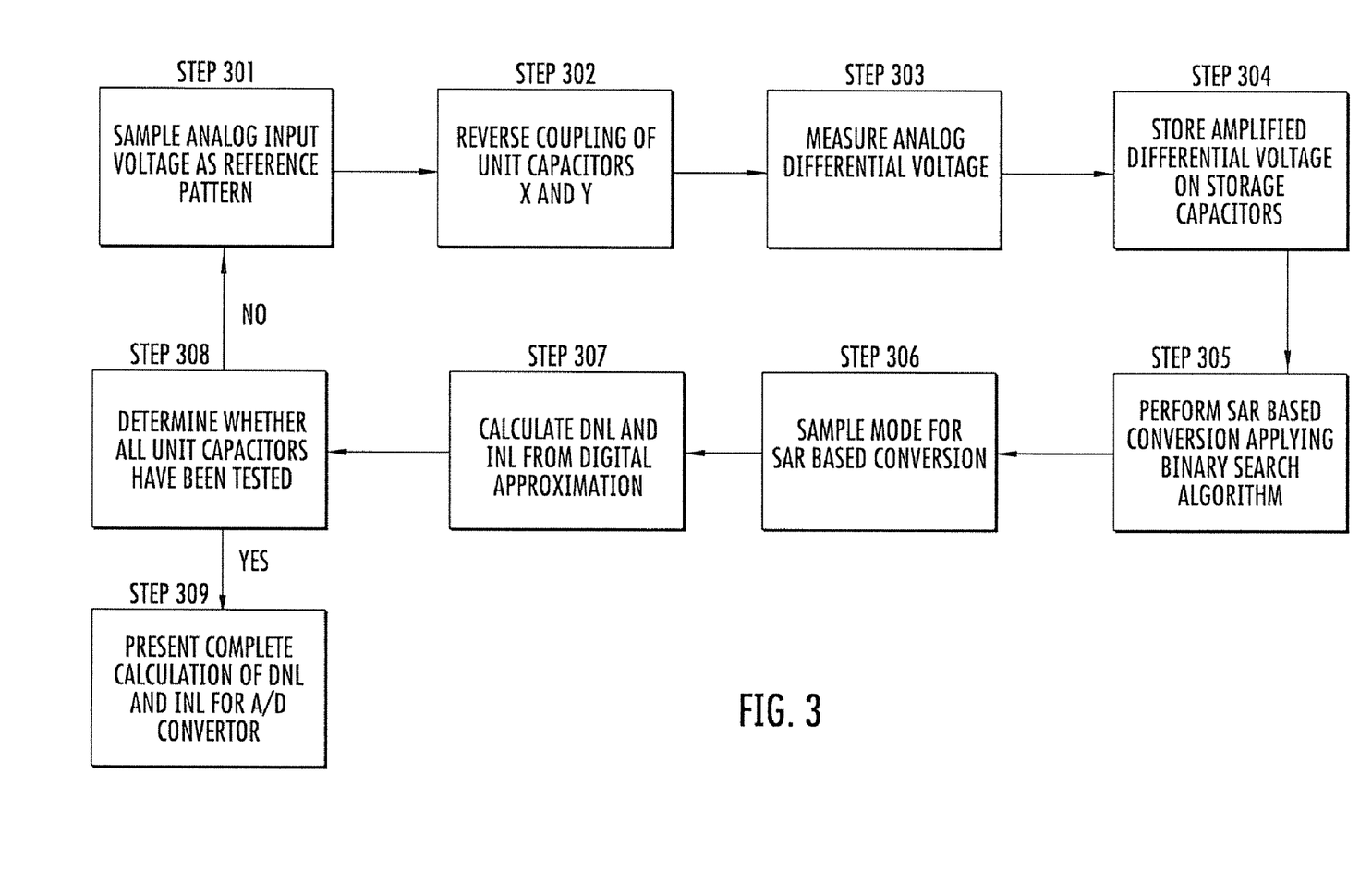
FIG. 3 is a flowchart for a method for analyzing the A/D converter according to the present invention.

FIG. 3 is a flowchart for a method for analyzing the A/D converter according to the present invention, and more specifically, for performing a self-test of capacitor array 102. In Step 301, the A/D converter 100 samples an analog input voltage from capacitor array 102 as a reference pattern. According to the exemplary embodiment, A/D converter 100 is configured in accordance with FIG. 2A to acquire this sample input voltage. As such, capacitor array 102 is coupled between the differential reference voltages $V_{REFP}$ and $V_{REFN}$ and the comparator 104, such that the comparator 104 samples the input voltage of the capacitor array 102.

In Step 302, the controller of A/D converter 100 reverses the couplings of two unit capacitors between the reference voltages $V_{REFP}$ and $V_{REFN}$ and the comparator inputs 106a, 106b, respectively. According to the exemplary embodiment, Step 302 is performed by configuring the A/D converter 100 as shown in FIG. 2B. As a result, comparator 104 measures an analog differential voltage (Step 303) and provides an amplified output that is stored on storage capacitors 112a, 112b (Step 304).

In Steps 305 and 306, A/D converter 100 performs a conventional analog-to-digital conversion of the amplified differential output that is stored on storage capacitors 112a, 112b. As discussed above, the A/D converter is adapted to function as a SAR based A/D converter. In Step 305, the A/D converter 100 is configured as shown in FIG. 2C, such that it operates in a sample mode wherein an input voltage is sampled onto a plurality of unit capacitors in the capacitor array 102. Because storage capacitors 112a, 112b are coupled to capacitor array 102 in the third configuration as shown in FIG. 2C, the amplified differential voltage stored by the storage capacitors 112a, 112b serves as the input voltage that is sampled by the SAR based A/D converter.

In Step 306, the A/D converter 100 performs the SAR based conversion applying the binary search algorithm. In the exemplary embodiment, A/D converter 100 is set to the fourth configuration as shown in FIG. 2D, such that the controller of the A/D converter 100 is adapted to function as a SAR controller, providing a resulting code, which is the digital approximation of the amplified differential voltage and represents the capacitance of the pair of unit capacitors. It should be understood that in an alternative embodiment, the controller of A/D converter 100 can perform a non-binary search algorithm. As is well known to those of ordinary skill in the art, conventional A/D converters may employ a non-binary (redundant) capacitor array. Therefore, in the alternative embodiment, if capacitor array 102 is non-binary (redundant), applying a non-binary search algorithm would still result in a digital approximation of the amplified differential voltage.

The digital approximation can be transmitted to a computer or the like, which can calculate the DNL and INL of the particular output code of A/D converter 100 (Step 307). In Step 308, the controller determines whether the next pair of unit capacitors of capacitor array 102 has been tested. If not, steps 301-307 are repeated to test the next pair of unit capacitors. Once all pairs have been tested, the process is finished such that a complete representation of the DNL and INL of A/D converter 100 can be calculated (Step 309).

In an alternative embodiment, the analog input voltage from capacitor array 102 that is sampled in Step 301 is stored in the controller of the A/D converter 100. It should be known to those of ordinary skill in the art that the controller can comprise memory provided to store the sampled input voltage. Accordingly, in order to test each pair of unit capacitors of capacitor array 102, only steps 302-307 must be repeated. In yet another embodiment of the present invention, a plurality of pairs of unit capacitors less than all of the unit capacitors of capacitor array 102 may be tested.

It should further be understood that because the controller of A/D converter 100 is provided to reconfigure A/D converter 100 to perform steps 301-309, the apparatus and method described herein function as a self-test of capacitor array 102. However, it should be understood that the controller of A/D converter 100 can also be controlled by a user to test one or more pairs of unit capacitors of capacitor array 102.

Figure 4A:
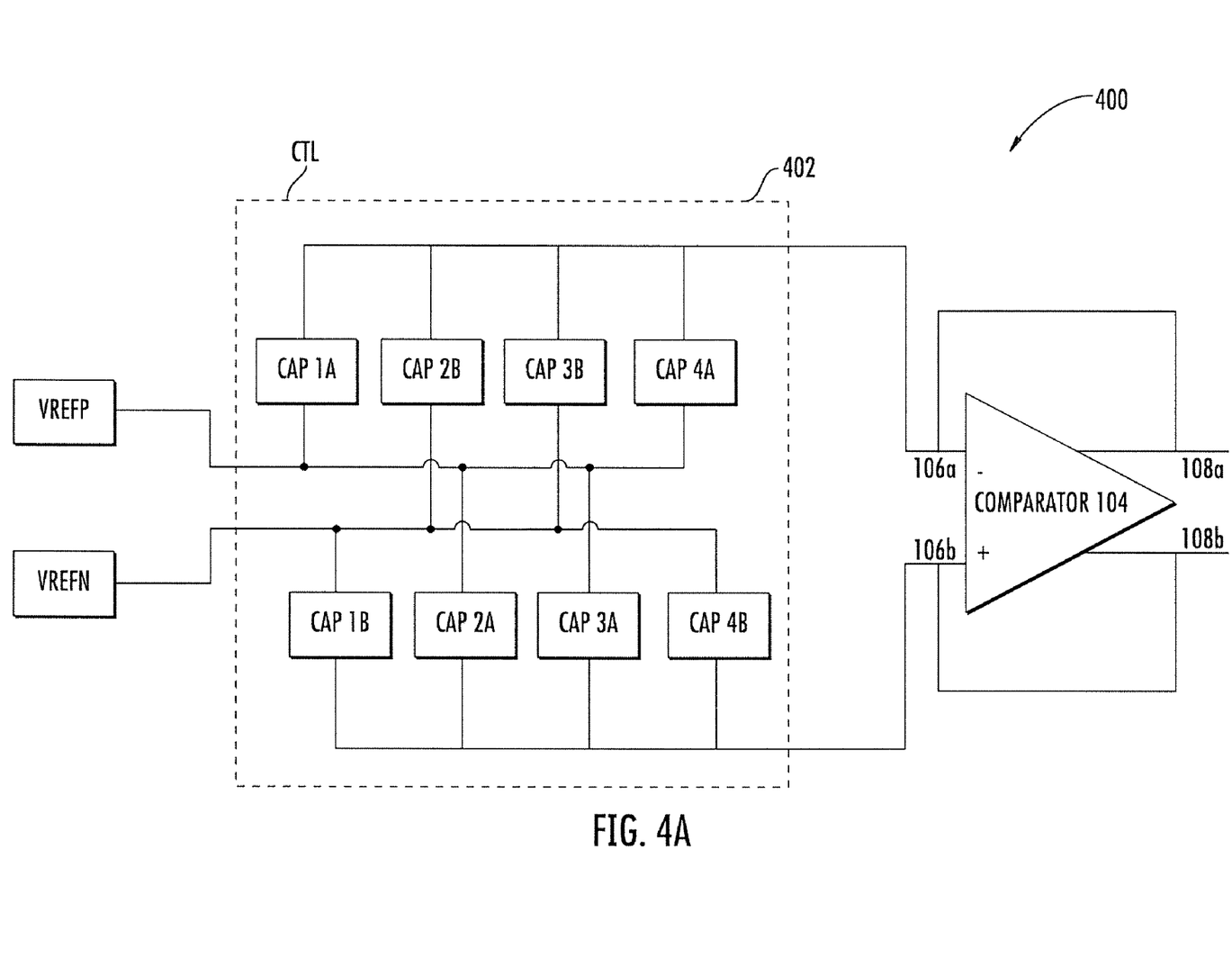
FIG. 4A is a detailed schematic diagram of a first configuration of an exemplary two-bit A/D converter according to the present invention.
Figure 4B:
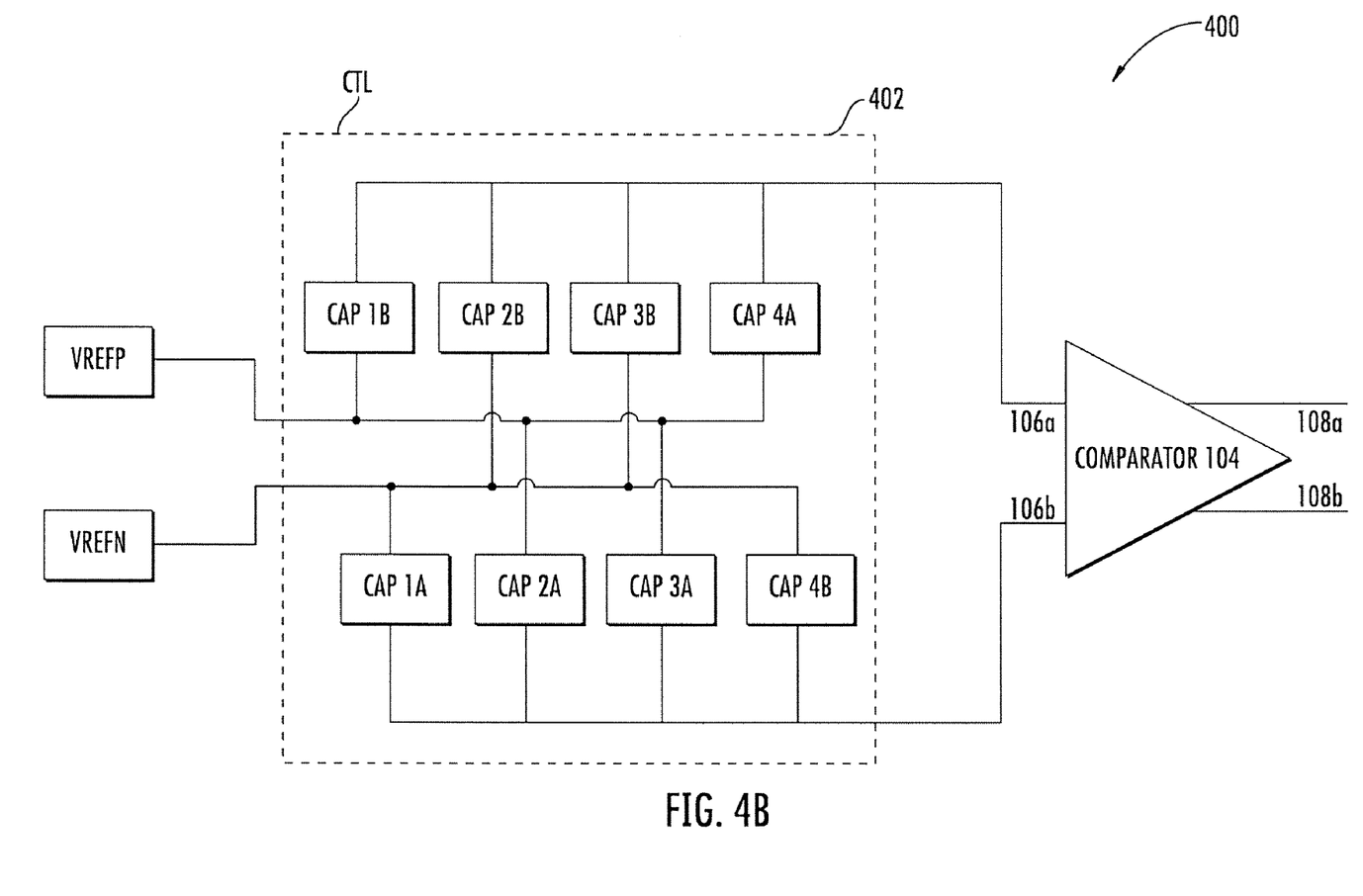
FIG. 4B is a detailed schematic diagram of a second configuration of an exemplary two-bit A/D converter according to the present invention.

To further illustrate the present invention, FIGS. 4A and 4B show an example of the present invention for a 2-bit A/D converter. As discussed above, an n-bit A/D converter requires $2^n$ unit capacitors coupled to each input of comparator 104. Accordingly, the 2-bit A/D converter 400 shown in FIG. 4A comprises four unit capacitors coupled to each input 106a, 106b of comparator 104. To avoid unnecessarily obscuring aspects of this example, only the reference voltages $V_{REFP}$ and $V_{REFN}$, unit capacitors of capacitor array 402, and comparator 104 are shown. However, this example is intended to be interpreted in light of the configurations and embodiments of the A/D converter 100 discussed above, including all aforementioned circuit components.

Referring to FIG. 4A, A/D converter 400 is initially adapted to sample an analog input voltage from capacitor array 402. Similar to the configuration shown in FIG. 2A, two unit capacitors (CAPS 2A & 3A) are coupled between $V_{REFP}$ and non-inverting input 106b; two unit capacitors (CAPS 1A & 4A) are coupled between $V_{REFP}$ and inverting input 106a; two unit capacitors (CAPS 2B & 3B) are coupled between $V_{REFN}$ and inverting input 106a; and two unit capacitors (CAPS 1B & 4B) are coupled between $V_{REFN}$ and non-inverting input 106b. Moreover, comparator 104 operates with feedback to function as a unity gain amplifier, such that comparator 402 can sample the analog input voltage of capacitor array 402.

Once the input voltage is sampled, the controller (not shown) of A/D converter 400 selects and reverses the couplings of two of the unit capacitors (CAPS 1A & 1B) between the reference voltages $V_{REFP}$ and $V_{REFN}$ and the comparator inputs 106a, 106b, respectively, as shown in FIG. 4B. The other unit capacitors of capacitor array 402 remain coupled as described above with respect to FIG. 4A. Moreover, comparator 104 is adapted to operate without feedback to function as a high speed comparator, and, therefore, measure the differential voltage as a result of the switch, as described above with respect to the configuration shown in FIG. 2B. As discussed above, the measured differential voltage is then converted to digital form using conventional A/D conversion techniques, as described above with respect to the configurations shown in FIGS. 2C and 2D, such that the capacitance of capacitors 1A and 1B can be measured and the DNL and INL for the corresponding output code can be calculated. This process can be repeated for unit capacitors 2A, 2B, 3A, 3B, 4A, and 4B in order to obtain a complete representation of the DNL and INL of A/D converter 400.

While the invention has been described in conjunction with an exemplary embodiment, it is understood that the term "exemplary" is merely meant as an example, rather than the best or optimal. Accordingly, the invention is intended to cover alternatives, modifications and equivalents, which may be included within the spirit and scope of the invention.

Additionally, in the preceding detailed description of the present invention, numerous specific details have been set forth in order to provide a thorough understanding of the present invention. However, it should be apparent to one of ordinary skill in the art that the present invention may be practiced without these specific details. In other instances, well-known methods, procedures, components, and circuits have not been described in detail so as not to unnecessarily obscure aspects of the present invention.

The invention claimed is:

1. An analog-to-digital converter comprising:
   a capacitor array having a plurality of unit capacitors, each having first and second inputs;
   a comparator having a pair of inputs and at least one output; and
   a controller configured to couple one input of each unit capacitor of the plurality of unit capacitors to the inputs of the comparator, to control a feedback loop between the pair of inputs and the at least one output of the comparator, and to switch coupling of a selected pair of unit capacitors between the inputs of the comparator.

2. The analog-to-digital converter of claim 1, wherein the comparator has a pair of outputs.

3. The analog-to-digital converter of claim 2, further comprising storage capacitors coupled to the respective outputs of the comparators.

4. The analog-to-digital converter of claim 3, wherein the storage capacitors are coupled to the capacitor array.

5. The analog-to-digital converter of claim 1, wherein a first input of each unit capacitor is coupled to one of first and second respective potentials.

6. The analog-to-digital converter of claim 1, wherein the controller is further configured to switch coupling of the selected pair of unit capacitors between first and second reference potentials.

7. The analog-to-digital converter of claim 1, where the capacitor array is comprised of two capacitor banks.

8. The analog-to-digital converter of claim 1, wherein the controller is configured to perform a self-test of the capacitor array.

9. The analog-to-digital converter of claim 1, wherein the controller is controlled by a user.

10. A method of analyzing an analog-to-digital converter, comprising:
coupling a first input of each unit capacitor in a capacitor array to one of a pair of reference potentials;
coupling a second input of each unit capacitor of the capacitor array to one of a pair of inputs of a comparator;
reversing the coupling of a selected pair of unit capacitors between the first and second reference potentials;
measuring a differential voltage between the selected pair of unit capacitors in the capacitor array; and
determining a differential nonlinearity (DNL) based at least in part on the differential voltage.

11. The method according to claim 10,
wherein the measuring step further comprises reversing the coupling of the second input of a pair of unit capacitors of the capacitor array to the respective inputs of the comparator, and
wherein a voltage at the output of the comparator represents the differential voltage.

12. The method according to claim 11, wherein the comparator has a pair of outputs, and the measuring step further comprises coupling each of the outputs of the comparator to storage capacitors, and wherein the storage capacitors are configured to store the differential voltage.

13. The method according to claim 10, wherein the comparator has a pair of outputs, and the measuring step further comprises coupling each of the outputs of the comparator to a respective one of the inputs of the comparator.

14. The method of claim 12, further comprising converting the differential voltage from analog to digital form.

15. The method of claim 14, wherein the converting step comprises coupling the storage capacitors to the capacitor array.

16. The method of claim 14, wherein the converting step further comprises:
coupling each of the outputs of the comparator to a respective one of the inputs of the comparator,
wherein a first input of each unit capacitor of the capacitor array is coupled to a respective one of the inputs of the comparator, and a voltage at the outputs of the comparator represents a sampled input voltage.

17. The method of claim 10, wherein the measuring step is performed for all pairs of the unit capacitors in the capacitor array.

18. The method of claim 14, wherein the converting step further comprises performing a successive approximation register (SAR) based analog-to-digital conversion of the differential voltage.

19. The method of claim 10, further comprising calculating integral nonlinearity (INL) based at least in part on the DNL.

20. The method according to claim 11, wherein the measuring step further comprises storing the sampled input voltage in memory of the controller and applying that voltage each time the differential voltage is measured for a plurality of pairs of unit capacitors of the capacitor array.

* * * * *